United States Patent [19]
Rosen et al.

[11] 3,852,680
[45] Dec. 3, 1974

[54] AMPLIFIER USING A NEGATIVE RESISTANCE SEMICONDUCTIVE DEVICE OPERATIVE IN THE ANOMALOUS MODE

[75] Inventors: Arye Rosen, Cherry Hill; James Francis Reynolds, Hightstown, both of N.J.

[73] Assignee: RCA Corporation, New York, N.Y.

[22] Filed: Mar. 19, 1973

[21] Appl. No.: 342,373

[52] U.S. Cl. .................................. 330/34, 330/56
[51] Int. Cl. ............................................ H03f 3/10
[58] Field of Search ....... 330/34, 56; 331/96, 107 R

[56] References Cited

UNITED STATES PATENTS 3,721,919 3/1973 Grace ............................ 331/107 R

OTHER PUBLICATIONS

Reynolds et al., "Coupled TEM Bar Circuit for L—Band Silicon Avalanche Oscillators," IEEE Journal of Solid-State Circuits, Vol. SC-5, No. 6, December 1970, pp. 346–353.

Pratt, "High-Efficiency Avalanche Mode In Microstrip," Electronics Letters, Vol. 5, No. 20, Oct. 2, 1969, pp. 467, 468.

Ku et al., "Gain-Bandwidth Optimization of Avalanche-Diode Amplifiers," IEEE Transactions on Microwave Theory and Techniques, MTT-18, No. 11, November 1970, pp. 932–942.

*Primary Examiner*—James B. Mullins
*Attorney, Agent, or Firm*—Edward J. Norton; Joseph D. Lazar; Robert L. Troike

[57] ABSTRACT

The bandwidth of an amplifier using a negative resistance semiconductive device operative in the anomalous mode is increased by terminating bandwidth determining diode generated signals at harmonically related frequencies in a complex impedance.

5 Claims, 2 Drawing Figures

AMPLIFIER USING A NEGATIVE RESISTANCE SEMICONDUCTIVE DEVICE OPERATIVE IN THE ANOMALOUS MODE

BACKGROUND OF THE INVENTION

1. Field of the Invention

This invention relates to microwave amplifiers and more particularly to microwave amplifiers using a negative resistance semiconductive device operative in the anomalous mode.

2. Description of the Prior Art

A coupled transmission line amplifier using an avalanche diode operative in the anomalous mode has been disclosed by Rosen and Reynolds in U.S. Pat. No. 3,721,918, assigned to the same assignee as the present application. The boundary conditions for operating an avalanche diode in the anomalous mode require the utilization of diode generated signals at frequencies harmonically related to the desired operating frequency. In the prior art, such amplifiers used some form of frequency filtering combined with a circuit element that provided only a reactive termination to the diode at the necessary higher order frequencies. Such circuits do not provide a complex impedance for terminating signals at critical bandwidth determining diode generated harmonic frequencies. Such circuits, thus result in an amplifier having a relatively narrow dynamic bandwidth and low operating efficiency.

SUMMARY OF THE INVENTION

An amplifier comprising a first transmission line has a center conductor capacitively coupled to the center conductor of a second transmission line. A first electrode of a negative resistance semiconductive device is connected to one end of the second transmission line center conductor and a second electrode of the semiconductive device is connected to ground potential. The semiconductive device generates signals at harmonically related frequencies and amplifies an input microwave signal in response to a reverse bias signal exceeding the predetermined breakdown voltage of the device. The amplifier includes means for applying, to the semiconductive device, a D.C. reverse bias signal having a magnitude less than the breakdown voltage and means for coupling to the device, the input microwave signal having a predetermined magnitude. The combination of the input microwave signal and the D.C. reverse bias signal has a magnitude exceeding the reverse breakdown voltage. The operating bandwidth of the amplifier is determined by including as part of the amplifier circuit means for terminating diode generated signals at a first bandwidth determining harmonic frequency in a first complex impedance having real and reactive components and means for terminating diode generated signals at a second bandwidth determining harmonic frequency in a second complex impedance having real and reactive components.

DESCRIPTION OF THE PREFERRED EMBODIMENT

Figure 1:
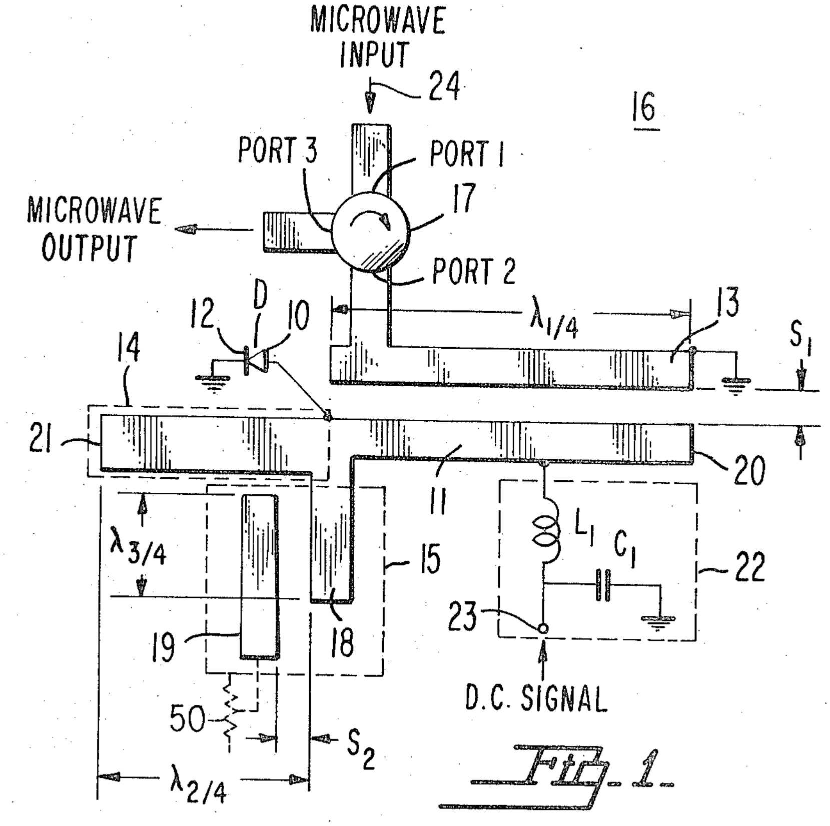
FIG. 1 is a schematic diagram of a broadband microwave amplifier arranged to amplify signals at the fundamental frequency of the anomalous mode of avalanche diode operation.

Referring to FIG. 1, there is shown a schematic diagram of a broadband microwave amplifier circuit 16 using an avalanche diode D operating in the anomalous or high efficiency mode. Circuit 16 is a coupled transmission line amplifier arranged to amplify microwave signals over a predetermined bandwidth centered at frequency $f_o$, where $f_o$ is the fundamental frequency generated by diode D in response to a critical reverse bias signal. Conductors 11, 13, 18 and 19 are center conductors of suitable TEM mode transmission lines provided with ground conductors (not shown). A microstrip transmission line is an example of a TEM mode transmission line having a center conductor separated from a ground potential conductor by dielectric material, air or a combination of both. Diode D is connected by its electrodes 10 and 12 between the center conductor 11 and a ground conductor, not shown. Preferably, the diode electrode having the better thermal path is connected to the ground conductor. Thus, cathode 12 of diode D is connected to ground and anode 10 of diode D is connected to open circuited transmission line center conductor 11 near the open circuited end of center conductor 13. A D.C. reverse bias signal from a bias supply, not shown, is coupled across electrodes 10 and 12 of diode D through a biasing circuit 22 that prevents the leakage of microwave signals into the D.C. bias supply, not shown. Such a biasing circuit 22 may be a series combination of the high inductance lead $L_1$ and the bypass capacitor $C_1$. One terminal of high inductance lead $L_1$ is connected to center conductor 11 and is therefore electrically connected to anode 10 of diode D. The other terminal of inductor $L_1$ is connected to one terminal of bypass capacitor $C_1$. The other terminal of bypass capacitor $C_1$ is connected to ground potential. At microwave frequencies, bypass capacitor $C_1$ presents a low impedance path to ground. A D.C. bias signal is applied to the junction 23 between inductor $L_1$ and capacitor $C_1$. When diode D is used in an amplifier circuit, the magnitude of the D.C. reverse bias signal is slightly less than the predetermined breakdown voltage of diode D.

An avalanche diode operative in the anomalous mode is a negative resistance semiconductor device capable of being triggered into amplifying a microwave input signal by the application, across the diode electrodes, of a reverse bias signal comprising a combination of a D.C. bias signal and the microwave input signal. The magnitude of the combined D.C. and microwave signals exceed the magnitude of the predetermined breakdown voltage of diode D. The reverse bias signal causes a displacement current or electric field in the depletion layer of the semiconductive material of the diode. Carriers are thereby created at the point of maximum electric field within the diode's depletion layer. It is believed that the carrier density is increased as the carriers collide with other atoms of the material and create more carriers. The displacement current may also be considered a wavefront, moving with a specific wave velocity, provided the displacement current has a very fast rise time. If the wave velocity of the displacement current is greater than the saturation velocity of the carriers, a high density of holes and electrons or carriers will be left in the wake of this wavefront. As a result of the concentration of holes and electrons, the electric field is reduced and the velocity of the carriers is diminished, leading to the formation of a dense plasma. Microwave signals at a fundamental frequency $f_o$ and other harmonically related frequencies is obtained from an avalanche diode by extraction of energy from the trapped plasma.

The fast rise time of the displacement current needed to effect a wavefront displacement current can be achieved according to the present invention by utilizing signals at diode generated harmonic frequencies caused by ionization at low currents. The signals effected at harmonically related frequencies is such as to trigger the avalanche diode into a high efficiency mode of operation, which is termed the "anomalous mode." The avalanche diode in the anomalous mode emits signals at a frequency which is related to the ratio of the diode's depletion layer width to the velocity of the carriers in the plasma, and the electrical arrangement of the complementary microwave circuitry. In particular, the diode's complementary microwave circuitry is arranged to match the complex impedance of the diode to a terminating load impedance, not shown, at the desired frequency of operation. The desired frequency of operation may be the fundamental frequency of operation determined by the ratio of the diode's depletion layer width to the velocity of the carriers in the plasma, or any of the frequencies harmonically related to the fundamental frequency.

Unlike the prior art, which uses pure reactive terminations, the microwave circuit of the invention as illustrated in FIG. 1 is arranged to present different empirically determined signal terminating complex impedances, for diode generated signals at bandwidth determining harmonic frequencies.

The signal terminating complex impedances are initially determined from the known physical and electrical characteristics of the diode D and also from an approximation of the voltage and current waveforms (which are not sinusoidal) across the diode terminals 10 and 12 when diode D is operating. Thus, the bandwidth of an amplifier using an avalanche diode operating in the anomalous mode is increased according to the present invention by using suitable amplifier elements 14 and 15 which together provide the necessary complex impedance terminating signals at each bandwidth determining diode generated harmonic frequency, such as $2f_o$ and $3f_o$, as will be described. The empirically determined signal terminating complex impedance is not necessarily the same at each diode generated harmonic frequency. Circuit 16 is electrically arranged so that the signal terminating complex impedance at one harmonic frequency may be varied without substantially affecting the signal terminating complex impedance at other harmonic frequencies until the desired amplifier bandwidth is obtained. As will be explained below, amplifier elements 14 and 15 provide an empirically determined signal terminating complex impedance at discrete bandwidth determining diode generated harmonic frequencies. Amplifier elements 14 and 15 are electrically arranged to permit a variation in their signal terminating complex impedance without substantially affecting the complex impedance provided by circuit 16 at other harmonically related frequencies.

The microwave input signal coupled as indicated by arrow 24 to port 1 of circulator 17 is transmitted to diode D by center conductor 13 capacitively coupled to center conductor 11 over an electrical length from open circuited end 20 to diode electrode 10 of substantially $\lambda_1/4$, where $\lambda_1$ is the wavelength at the center frequency $f_o$ of the input signal. The directional properties of circulator 17 are such as to direct transmission of the microwave input signal from port 1 to port 2 of circulator 17. Port 2 of circulator 17 is connected near the open circuited end of center conductor 13. The other end of center conductor 13 is connected to ground potential. The physical spacing or separation $S_1$ between conductors 11 and 13 determines the magnitude of capacitive coupling between center conductors 11 and 13. The characteristic impedance of center conductors 11 and 13, the magnitude of capacitive coupling between center conductors 11 and 13, and the electrical length of center conductor 13 presents a reciprocal transformation from the impedance of circulator 17 to the complex impedance of diode D at center frequency $f_o$. A detailed description of the computation of the dimensions of center conductors such as conductors 11 and 13 with a separation $S_1$ that provides the previously mentioned impedance transformation may be found in the text "Microwave Filters Impedance-Matching Networks, and Coupling Structures" by Matthae et al., a 1964 publication of McGraw-Hill, Chapters 5 and 10.

Center conductor 11 is open circuited at both ends and has an electrical length of substantially $\lambda_1/4 + \lambda_2/4$, where $\lambda_1$ is the wavelength at the center frequency $f_o$ and $\lambda_2$ is the wavelength at the second harmonic, $2f_o$, of the center frequency $f_o$. The portion 14 of center conductor 11, from open circuited end 21 to diode electrode 10 forms a transmission line that functions as an amplifier element having a characteristic impedance and an electrical length of substantially $\lambda_2/4$ to provide diode D thereby with an empirically determined complex impedance having both a real and reactive component which terminates diode generated signals at the second harmonic, $2f_o$, of center frequency $f_o$. The complex impedance of amplifier element 14, at the second harmonic frequency, $2f_o$, may be varied by changing its electrical length, its characteristic impedance, or both. Ideally, a small change in the complex impedance of element 14 has negligible effect on the complex impedance presented by circuit 16 to diode D at frequencies other than the second harmonic frequency. Thus, in a system embodying the present invention, the phase of the second harmonic component of a signal may be adjusted by element 14 without affecting the phase relation of a third harmonic component of the signals. Similarly, the phase of a third harmonic component of a signal may be adjusted by element 15 without affecting the second harmonic componenet of the same signal.

The second amplifier element 15, comprising capacitively coupled center conductors 18 and 19, is arranged to provide diode D with an empirically determined complex impedance which terminates diode generated signals at the third harmonic, $3f_o$, of center frequency $f_o$. Center conductor 18 is connected to center conductor 11 near the open circuited end of center conductor 13. Center conductors 18 and 19 are capacitively coupled to each other, as shown in FIG. 1, throughout their mutually adjacent portions over an electrical length of $\lambda_3/4$, where $\lambda_3$ is the wavelength at the third harmonic $3f_o$ of center frequency $f_o$. The separation $S_2$, between center conductors 18 and 19, determines the magnitude of capacitive coupling between center conductors 18 and 19. The characteristic impedance of center conductors 18 and 19, the magnitude of capacitive coupling between center conductors 18 and 19, and the termination of center conductor 19 in an open circuit presents an empirically determined complex impedance which terminates diode generated signals at the third harmonic, $3f_o$, of center frequency $f_o$. The complex impedance of amplifier element 15 at the third harmonic frequency, $3f_o$, is varied by changing the characteristic impedance of center conductors 18 and 19, the separation $S_2$ between center conductors 18 and 19, or both. Ideally, a small change in the complex impedance of element 15, as with element 14, has negligible effect on the complex impedance presented by circuit 16 to diode D at frequencies other than the third harmonic frequency.

Center conductor 19 as illustrated is terminated in an open circuit or a reactive termination when it acts with center conductor 18 to present the bandwidth determining complex impedance terminating the third harmonic of center frequency $f_o$. Amplifier elements 15 has also performed satisfactorily with center conductor 19 terminated by a resistive termination 50.

In summary, circuit 16 is a microwave amplifier using an avalanche diode D operative in the anomalous mode and amplifier elements 14 and 15 which present different and variable complex impedances which terminate diode generated signals at several bandwidth determining harmonic frequencies. Unlike the prior art, amplifier elements 14 and 15 do not merely present a high reflective reactance for signals at all diode generated harmonic frequencies but present rather a complex impedance having both real and reactive components terminating signals at selected bandwidth determining frequencies.

It is believed that the phase of microwave signals at the bandwidth determining harmonic frequencies reflected back to diode D by the complex impedances presented by elements 14 and 15 is critical in the determination of the amplifier 16 operating bandwidth. The phase of the harmonic signals reflected by elements 14 and 15 back to diode D is dependent on the magnitude of the real and reactive portions of the complex impedance presented by elements 14 and 15 at these harmonic signals. Thus, the operating bandwidth of amplifier 16 is determined by the magnitude of the real and reactive portions of the complex impedance presented by elements 14 and 15 to signals at bandwidth determining harmonic frequencies. It is also believed that a relatively small and controllable rate of change, with frequency, of the real and/or reactive portion of the complex impedance presented by elements 14 and 15 at the selected harmonic frequencies is determinative of operating bandwidth of circuit 16.

Figure 2:
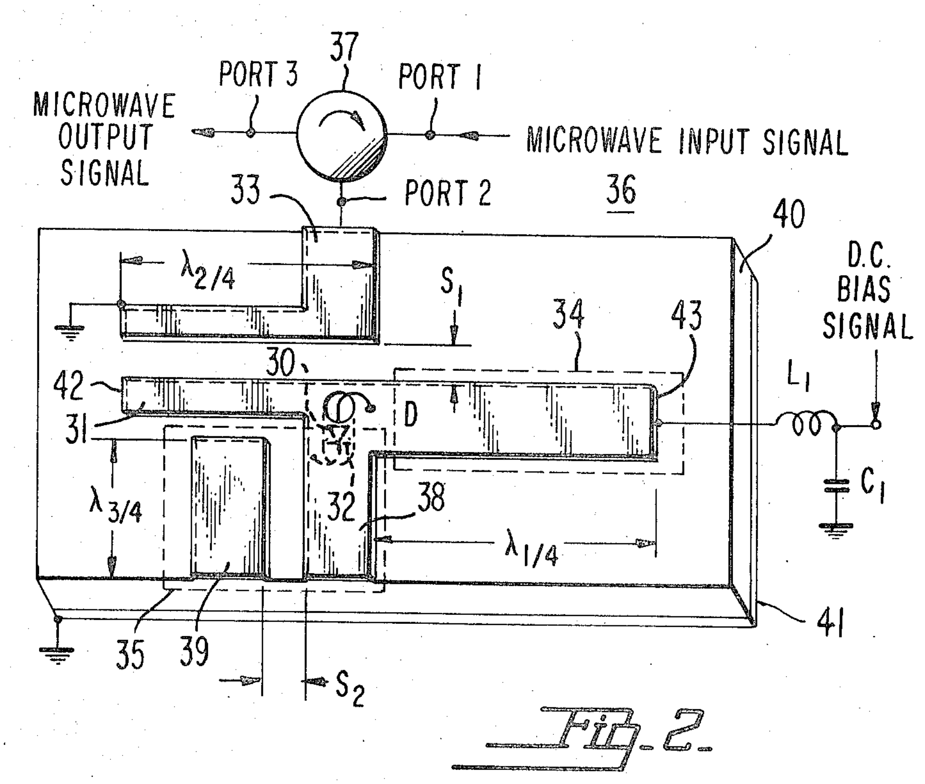
FIG. 2 is a plan view of a microwave amplifier constructed according to an embodiment of the invention.

Referrring now to FIG. 2, there is shown in substantially plan view a preferred microwave amplifier 30 constructed according to the present invention. As previously discussed, an avalanche diode D operative in the anomalous mode generates signals at a fundamental frequency and higher harmonic frequencies in response to an applied reverse bias signal exceeding the diode breakdown voltage. Avalanche diode D amplifies the input microwave signal when triggered into operation. The amplifier of FIG. 2 is arranged to operate with an input microwave signal centered at the second harmonic frequency $2f_o$ of the diode generated signal.

The amplifier is formed of conductive strips 31, 33, 38 and 39 which are etched or otherwise deposited on the top surface of a dielectric substrate 40 having a dielectric constant $\epsilon_r = 2.5$. Conductive strip 41 is a ground planar conductor etched or otherwise deposited on the bottom surface of dielectric substrate 40. The thickness of dielectric substrate 40 is 0.03 inches. Conductive strips or center conductors 31, 33, 38 and 39 on the top surface of dielectric substrate 40 and ground planar conductive strip 41 form microstrip transmission lines suitable for transmitting microwave signals.

A 25 watt microwave input signal, centered at 3.0 GHz, coupled to port 1 of circulator 37 is transmitted to diode D by center conductor 33 capacitively coupled to center conductor 31 over an electrical length, from open circuited end 42 to diode electrode 30, of substantially $\lambda_2/4$ or 0.400 inches, where $\lambda_2$ is the wavelength at 3.0 GHz. The directional properties of circulator 37 is such as to direct transmission of the microwave input signal from port 1 to port 2 of circulator 37. Port 2 of circulator 37 is connected near the open circuited end of center conductor 33. The other end of center conductor 33 is connected to ground planar conductor 41.

The 0.020 inch diameter silicon avalanche diode D used in the amplifier was fabricated by phosphorous diffusion in P-on-$P^+$ epitaxial layers. Diode D has an $n^+$ layer with a thickness of substantially 3$\mu$m (micrometers). The P layer resistivity is substantially 10 ohm-cm with a thickness of 3$\mu$m. The breakdown voltage of diode D is substantially 100 volts. The magnitude of the D.C. reverse bias signal applied across the diode electrodes 30 and 32 via the $L_1$ $C_1$ biasing circuit is less than the breakdown voltage necessary for operation. The physical and electrical characteristics of such a diode D provided fundamental frequency of diode operation is at 1.5 GHz.

The portion 34 of center conductor 31 from open circuited end 31 to diode electrode 30 is an amplifier element arranged to have a characteristic impedance and an electrical length of substantially $\lambda_1/4$ or 0.800 inches, where $\lambda_1$ is the wavelength at the fundamental frequency of diode operation, namely, 1.5 GHz. Amplifier element 34 provides diode D with an empirically determined complex impedance which terminates diode generated energy at the fundamental frequency.

Amplifier element 35 comprising center conductors 38 and 39 capacitively coupled over an electrical length of substantially $\lambda_3/4$ or 0.275 inches is arranged to provide diode D with an empirically determined complex impedance which terminates diode generated signals at the third harmonic frequency, 4.5 GHz.

The amplifier of FIG. 2 was operated over a 3 db fractional bandwidth of 15 per cent. The 25 watt input microwave signal centered at 3.0 GHz when electrically combined with a D.C. reverse bias signal magnitude slightly less than 100 volts, triggered diode D into amplifying operation. The 25 watt input signal was amplified to a 100 watt output signal transmitted from port 2 of circulator 37 to a load impedance terminating port 3. The gain of the amplifier is 6 db and the efficiency of operation is 19 per cent.

An embodiment of the invention has been shown and described in FIGS. 1 and 2 only by way of example. Various other embodiments and modifications thereof will be apparent to those skilled in the art within the scope of the invention as defined in the following claims.

What is claimed is:

1. An amplifier comprising a first transmission line having a center conductor capacitively coupled to the center conductor of a second transmission line having a first electrode of a negative resistance semiconductive device connected to one end of said second transmission line center conductor and a second electrode of said device connected to ground potential, said semiconductive device generating signals at harmonically related frequencies and amplifying an input microwave signal in response to a reverse bias signal exceeding the predetermined breakdown voltage of said device, the improvement comprising:

means for applying to said device a D.C. reverse bias signal having a magnitude less than said breakdown voltage;

means for coupling to said device, said input microwave signal having a predetermined magnitude, said input microwave signal magnitude and said D.C. reverse bias signal magnitude in combination exceeding said reverse breakdown voltage magnitude;

means for terminating said device generated signals at a first bandwidth determining harmonic frequency in a first complex impedance having real and reactive components determining amplifier operating bandwidth;

means for terminating said device generated signals at a second bandwidth determining harmonic frequency in a second complex impedance having real and reactive components for determining amplifier operating bandwith; and means for coupling said amplified input microwave signal from said semiconductive device.

2. An amplifier according to claim 1, further comprising:

means for directively coupling both said input microwave signal to said first transmission line center conductor and said amplified input microwave signal from said first transmission line center conductor to a terminating load impedance.

3. An amplifier according to claim 1, wherein said means for terminating said device generated signals at said first bandwidth determining harmonic frequency in a first complex impedance is a third transmission line having a center conductor with an open circuited end and a second end connected to said second center conductor one end, said third center conductor having an electrical length from said open circuited end to said second end of substantially $\lambda_1/4$, where $\lambda_1$ is the wavelength at said first bandwidth determining harmonic frequency.

4. An amplifier according to claim 1, wherein said means for terminating said device generated signals at said second bandwidth determining harmonic frequency in said second complex impedance is a combination of fourth and fifth transmission lines having center conductors capacitively coupled to each other over an electrical length of $\lambda_2/4$, where $\lambda_2$ is the wavelength at said second bandwidth determining harmonic frequency, said fourth transmission line center conductor being connected to said second center conductor at said one end and terminated in an open circuit at said other end, said fifth transmission line center conductor being terminated in an open circuit at both ends.

5. An amplifier according to claim 1, wherein said means for terminating said device generated signals at said second bandwidth determining harmonic frequency in said second complex impedance is a combination of fourth and fifth transmission lines having center conductors capacitively coupled to each other over an electrical length of $\lambda_2/4$, where $\lambda_2$ is the wavelength at said second bandwidth determining harmonic frequency, said fourth transmission line center conductor being connected to said second center conductor at said one end and terminated in an open circuit at said other end, said fifth transmission line center conductor being terminated in an open circuit at one end and a resistive termination at the other end.

* * * * *